United States Patent
Smick et al.

(10) Patent No.: US 8,101,488 B1
(45) Date of Patent: Jan. 24, 2012

(54) HYDROGEN IMPLANTATION WITH REDUCED RADIATION

(75) Inventors: Theodore H. Smick, Essex, MA (US); Steven Richards, Georgetown, MA (US); Geoffrey Ryding, Manchester, MA (US); Kenneth H Purser, Gloucester, MA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/978,558

(22) Filed: Dec. 25, 2010

(51) Int. Cl.
*H01L 21/336* (2006.01)
*H01L 21/425* (2006.01)

(52) U.S. Cl. ........ 438/305; 438/514; 438/515; 438/520; 250/423 R; 250/424; 250/492.21; 257/E21.001

(58) Field of Classification Search .............. 250/281, 250/282, 423 R, 424, 492.2, 492.21, 492.3; 438/305, 306, 308, 514, 515, 520
See application file for complete search history.

(56) References Cited

U.S. PATENT DOCUMENTS
7,989,784 B2 * 8/2011 Glavish et al. ........... 250/492.21

OTHER PUBLICATIONS

Parker. "Balston Hydrogen Generators." Products. Web. Dec. 13, 2010. <http://www.parker.com/portal/site/PARKER/menuitem.de7b26ee6a659c147cf26710237ad1ca/?vgnextoid=fcc9b5bbec622110VgnVCM10000032a71dacRCRD&vgnextfmt=default&vgnextdiv=&vgnextcatid=10908&vgnextcat=BALSTON+HYDROGEN+GENERATORS&Wtky=>.

Roberge, Steven, Heiner Ryssel, and Bob Brown. "Saftey Considerations for Ion Implanters." Ion Implantation: Science and Technology. By J. F. Ziegler. [Yorktown, NY]: [Ion Implantation Technology Co], 1996. 8.1-8.40.

Saadatmand et al., "Radiation Emission from Ion Implanters When Implanting Hydrogen and Deuterium," Proc. 1998 Intl. Cont. on Ion Implantation Tech., pp. 292-295, 1999.

* cited by examiner

*Primary Examiner* — Hsien Ming Lee
(74) *Attorney, Agent, or Firm* — The Mueller Law Office, P.C.

(57) ABSTRACT

Embodiments of the present invention provide for a system for accelerating hydrogen ions. A hydrogen generator holding a supply of water is configured to generate a flow of hydrogen gas from the supply of water. An ion source structure is configured to generate a plurality of hydrogen ions from the flow of hydrogen gas. An accelerator tube is configured to accelerate the plurality of hydrogen ions. The supply of water has an isotopic ratio of deuterium that is smaller than the isotopic ratio of deuterium in Vienna Standard Mean Ocean Water.

23 Claims, 4 Drawing Sheets

HYDROGEN IMPLANTATION WITH REDUCED RADIATION

FIELD OF THE INVENTION

The invention relates generally to manufacturing processes utilizing accelerated particles, and more specifically to a manufacturing process involving implantation of hydrogen ions into target materials.

BACKGROUND OF THE INVENTION

Ion implantation is a process wherein ions of a particular element are implanted into a target object. The essence of the process is the acceleration of ions to a certain energy level and the imposition of a target object into the path of the accelerated ions. The energy to which the particles are accelerated correlates with the depth to which the ions are implanted into the material. At low energy levels, the result of this process is a deposition of material onto the surface of the target object. At higher energy levels, a layer of the implanted material can be formed a given distance into the target object. If the energy levels are well controlled, the layer of implanted ions will be planar and uniform.

Ion implantation is used often in the field of semiconductor fabrication. Ions such as boron, phosphorous or arsenic are generally created from a gas source and accelerated into a silicon wafer to dope the silicon to be either p-type or n-type. Ion implantation is also used in semiconductor device fabrication in the separation by implantation of oxygen (SIMOX) process wherein the implantation of oxygen into a silicon wafer is followed by a high temperature annealing process to form a buried layer of silicon dioxide within the wafer. Another common process involves the implantation of hydrogen ions into a donor semiconductor wafer. This process was developed in the early 1990s. After the ions are implanted, the layer of silicon above the implanted ions is removed from the top of the donor semiconductor wafer. This process has been successfully utilized in the production of thin films for silicon on insulator (SOI) devices. The process generally uses hydrogen ions because their light weight allows for relatively low energy implantation.

A standard ion implanter 100 can be described with reference to FIG. 1. An ion source 101 produces ions of a particular species which then move towards a mass selection magnet 102 and an accelerator tube 103 for ultimate delivery to a target material structure 106. Ion source 101 is generally a bottle of gas 104 that provides gas to ion source structure 105 for ionization. Since the speed and species of the ions striking target material structure 106 must be well controlled, it is necessary to screen out different species of ions from ion beam 107. Mass selection magnet 102 is therefore tuned to screen out unwanted ions from ion beam 107 to prevent them from striking target material 106. Since particles with different masses bend to a different degree in a magnetic field, mass selection magnet 102 bends the desired particles just enough that they pass through filter 108. However, particles with different masses either bend too much or too little in the magnetic field and strike beam dump plates 109.

The acceleration of charged particles can result in the production of harmful radiation. This is because the collision of two charged particles can result in a nuclear reaction which in turn may result in the release of dangerous secondary particles or radiation. Collisions that produce free neutrons are particularly hazardous in that neutrons have high kinetic energy and pass through most materials but are interactive enough to cause biological damage. Given the danger of neutron radiation, the acceleration of deuterium is considered hazardous. Deuterium ($^2$H) is a stable isotope of hydrogen having a single neutron and proton. The acceleration of deuterium can result in a deuterium-deuterium collision resulting in the generation of a neutron through the reaction $^2$H(d,n)$^3$He. This reaction can occur at energies lower than 20 kiloelectron volts (keV) and will occur with increasing frequency at higher energies. At higher energies, the acceleration of deuterium can lead to a deuterium-carbon collision and the generation of a neutron through either the reaction $^{13}$C(d,n)$^{14}$N or $^{12}$C(d,n)$^{13}$N. The carbon in these reactions is present in ion implanters as part of mass selection magnet 102, plates 109, and various other parts such as faraday cups and the housing for target material structure 106. The $^{12}$C(d,n)$^{13}$N reaction has a threshold energy of 328 keV.

SUMMARY OF INVENTION

In one embodiment of the invention, a system for accelerating hydrogen ions is provided. The system comprises a hydrogen generator holding a supply of water that is configured to generate a flow of hydrogen gas from the supply of water. The system additionally comprises an ion source structure configured to generate a plurality of hydrogen ions from the flow of hydrogen gas. The system additionally comprises an accelerator tube configured to accelerate the plurality of hydrogen ions. The supply of water held by the hydrogen generator has an isotopic ratio of deuterium that is smaller than the isotopic ratio of deuterium in Vienna Standard Mean Ocean Water.

In another embodiment of the invention, a system for accelerating hydrogen ions is provided. The system comprises a hydrogen gas source providing a flow of hydrogen gas. The system additionally comprises an ion source structure configured to receive the flow of hydrogen gas and generate a plurality of hydrogen ions. The system additionally comprises an accelerator tube configured to receive and accelerate the plurality of hydrogen ions. The isotopic ratio of deuterium in the flow of hydrogen gas is less than 100 parts per million.

In another embodiment of the invention, a method is provided. In one step a flow of hydrogen gas is generated using a hydrogen gas source. In another step a plurality of hydrogen ions are generated from the flow of hydrogen gas using an ion source structure. In another step a plurality of hydrogen ions is accelerated using an accelerator tube. An isotopic ratio of deuterium in the flow of hydrogen gas is less than 100 parts per million.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Ion implanters are currently deployed in applications that are quite diverse from their traditional applications. For example, Sivaram et al., U.S. patent application Ser. No. 12/026,530, "Method to Form a Photovoltaic Cell Comprising a Thin Lamina," filed Feb. 5, 2008 teaches fabrication of a photovoltaic cell formed from a semiconductor lamina cleaved from a donor wafer, for example using ion implantation. Laminae for such photovoltaic cells may have thicknesses that are, for example, between about 1 and about 20 microns (μm). In contrast, the thicknesses of cleaved thin films used in SOI applications are generally tenths of a micron or less. The production of laminae for photovoltaic cells thus requires deeper implantation than traditional applications. As a result, ion implantation is performed using much higher energies as compared to prior methods. Implanters and associated methods suitable for such high-energy implantation are described by Ryding et al., U.S. patent application Ser. No. 12/494,268, "Ion Implantation Apparatus and a Method for Fluid Cooling," filed Jun. 30, 2009; or by Purser et al., U.S. patent application Ser. No. 12/621,689, "Method and Apparatus for Modifying a Ribbon-Shaped Ion Beam," filed Nov. 19, 2009, both owned by the assignee of the present application and hereby incorporated by reference. Although industry sources evaluating the safety of hydrogen implantation processes note that the acceleration of ions derived from hydrogen gas does not present a hazard in terms of the production of neutron radiation, deuterium is present in natural hydrogen to an appreciable degree so the acceleration of ions derived from hydrogen gas results in the deleterious acceleration of deuterium ions.

Figure 1:
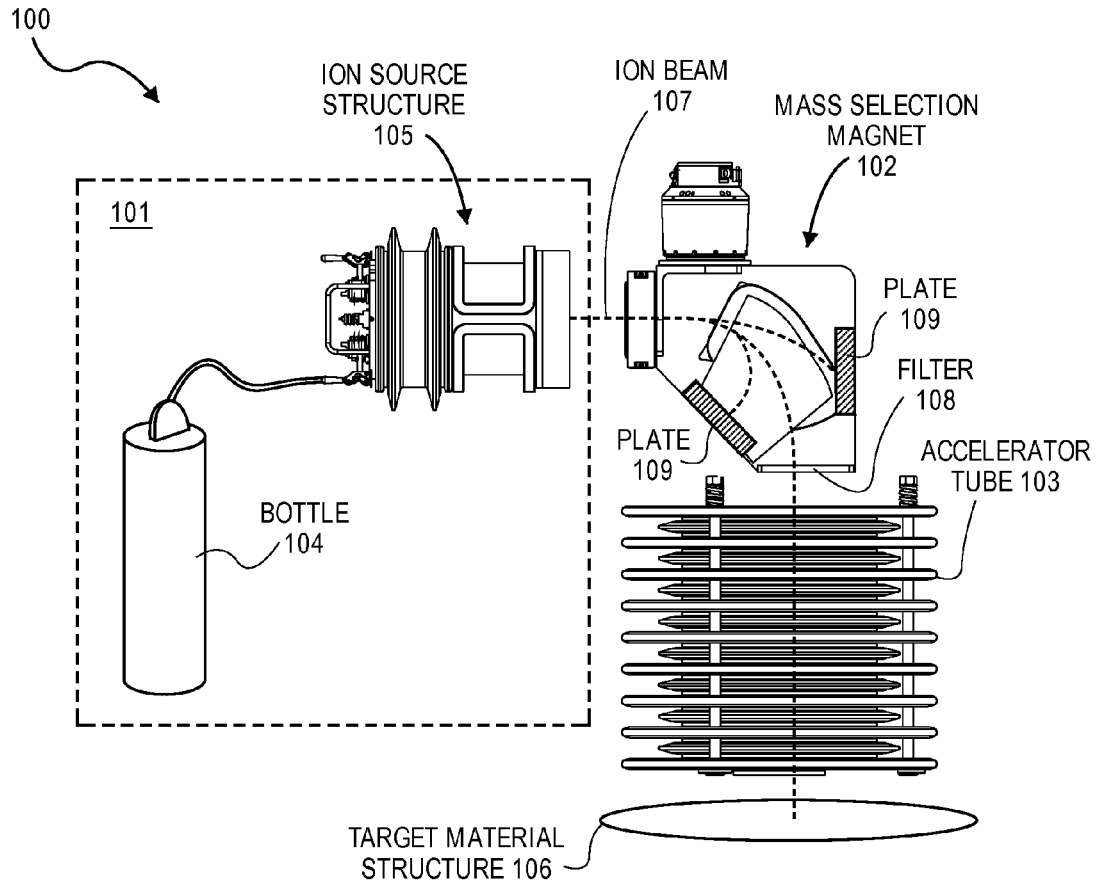
FIG. 1 illustrates a block diagram of a system for implanting ions into a target material that is in accordance with the prior art.

There are numerous potential approaches for dealing with the issue of increased radiation in ion implantation facilities. One approach is the utilization of mass separation filters to screen deuterium out of the ion beam before it is accelerated into the target material. Taking the apparatus in FIG. 1 as an example, mass selection magnet 102 and filter 108 can be configured such that deuterium ions in ion beam 107 end up being collected on plates 109 and are not accelerated to a point where they can strike carbon and trigger the $^{12}C(d,n)$ $^{13}N$ reaction. Another approach is to sheath the ion implanter in a radiation shield comprising a layer of polyethylene, water, or boron-loaded paraffin wax which would collect the neutron radiation before it could inflict biological harm to people working in the facility. A final approach is to avoid accelerating the ions to energies above the 328 keV threshold above which the deleterious reactions may take place.

Although the techniques discussed above have the potential to combat the problem of neutron generation in ion implanters, they fail to solve the problem in a cost-effective and efficient manner. The use of mass selection magnets is not totally reliable and there is a statistically appreciable possibility that deuterium ions will pass through the filter and be accelerated to a dangerous level of energy. In addition, the plates and faraday cups into which the deuterium ions are filtered pose a radiation hazard themselves as deuterium builds up in the plates and creates a situation that is ripe for the occurrence of the neutron-generating deuterium-deuterium reaction described above. Although this problem can be mitigated by the replacement of deuterium loaded components, ion implanters are complex pieces of industrial equipment so switching out the parts on which deuterium has collected is extremely costly. Likewise, the use of radiation shields is an insufficient solution given the similarly high cost associated with maintaining their efficacy by replenishing the shield material. Also, the production of such shields is extremely costly because of the large size of the industrial equipment involved with ion implantation. Finally, not accelerating the ions beyond the critical thresholds is also an ineffective and costly solution given that high energy implantation enables the cost-effective implantation of ions into the target material.

These alternative approaches may be capable of accelerating ions without generating neutron radiation but they fail to do so in a cost-effective manner. Far from trivial, the cost of maintaining equipment is of paramount importance given that ion implanters are often used to produce products that are highly sensitive to marginal costs. For these products, even the slightest decrease in the maintenance costs for capital equipment is extremely important. In particular, the production of laminae for photovoltaic cells requires that capital costs be kept to a minimum. If solar energy is to be cost-competitive with other forms of energy, the reduction of costs associated with the production of solar cells cannot be ignored.

Specific embodiments of the present invention provide for the cost-effective implantation of accelerated hydrogen ions into the surface of a target material without the deleterious generation of neutron radiation. Embodiments of the present invention utilize a deuterium depleted feed gas for the ion source of an ion implantation system. In specific embodiments of the invention, the deuterium depleted feed gas is produced through the electrolysis of deuterium depleted water using a hydrogen generator. Ion implanters operating in accordance with these embodiments can accelerate ions in a cost-effective manner to energies in excess of 400 keV without the production of harmful neutron radiation and can operate for an unexpectedly long period of time without any form of maintenance to further reduce neutron radiation. Embodiments of the present invention utilizing a hydrogen generator also avoid safety concerns associated with high pressure bottles of feed gas and operate using cost-effective readily available source materials.

Figure 2:
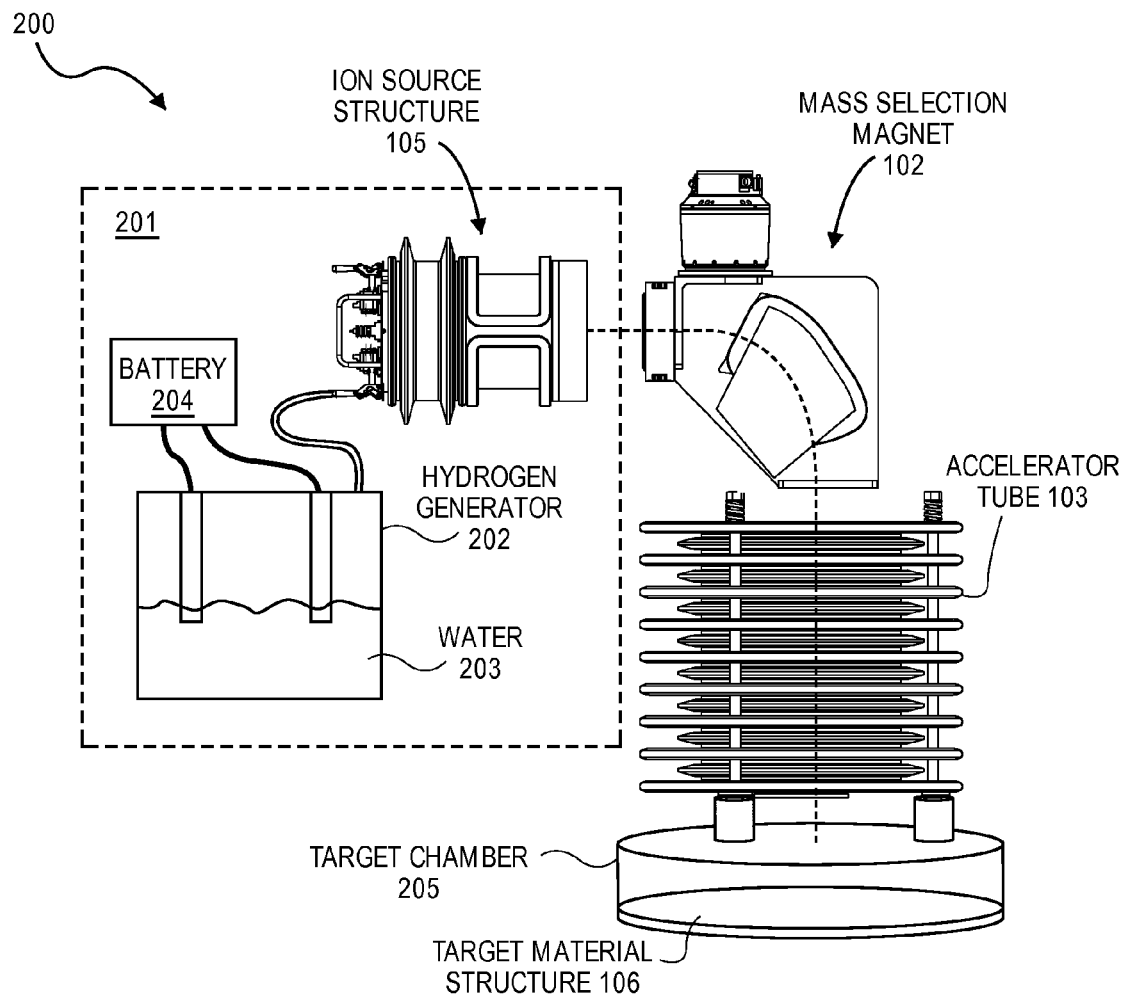
FIG. 2 illustrates a block diagram of a system for accelerating ions that is in accordance with the present invention.

A specific embodiment of the invention can be described with reference to FIG. 2. FIG. 2 illustrates a system for accelerating ions that is in accordance with the present invention. Ion accelerator 200 comprises ion source 201 which in turn comprises hydrogen generator 202 and ion source structure 105. Hydrogen generator 202 holds water supply 203 and is configured to generate a flow of hydrogen gas from water supply 203. Ion source structure 105 is configured to generate a plurality of hydrogen ions from the resulting flow of hydrogen gas. Accelerator tube 103 is configured to accelerate this plurality of hydrogen ions from ion source structure 105. In specific embodiments of the invention, the flow of hydrogen gas will be produced by hydrogen generator 202 through the electrolysis of water supply 203. In specific embodiments of the invention, electrolysis will be achieved using power source 204, in FIG. 2 a battery, to provide the energy necessary to split the water molecules into their elemental components. Water supply 203 has an isotopic ratio of deuterium that can be substantially smaller than the isotopic ratio of deuterium in Vienna Standard Mean Ocean Water (VSMOW). The VSMOW standard is meant to describe, among other things, the isotopic ratio of deuterium that is naturally occurring in the earth's oceans. In specific embodiments of the invention, the isotopic ratio of deuterium in water supply 203 can be substantially less than 100 parts per million (ppm).

Specific embodiments of the invention that are in accordance with those described with reference to FIG. 2 advantageously accelerate ions to high energies without the deleterious production of neutron radiation using cost-effective and readily available components. In stark contrast to deuterium enriched water—which has been used extensively in nuclear reactors and for producing nuclear isotopes—deuterium depleted water is not often used for industrial purposes. However, studies from the early 1990s indicated that deuterium depleted water may have medicinal applicability as a preventative measure against cancer. Therefore, deuterium depleted water is commercially available with deuterium concentrations as small as 1 ppm. Hydrogen generators are also commercially available as they are used often in commercial spectrographs. When deuterium depleted water is used as the water source for a hydrogen generator as set forth in the present invention, the hydrogen gas that is produced is also deuterium depleted. If this gas is in turn used as a source of ions in an ion implanter, the neutron-generating deuterium reactions are avoided altogether because the deuterium is not present in the system to be accelerated in the first place. Therefore, embodiments of the present invention utilize a cost-effective and commercially available resource to produce an apparatus that can accelerate hydrogen ions at high energies without the generation of harmful neutron radiation.

In specific embodiments of the invention, the hydrogen ions accelerated in accordance with the present invention can be used to cleave a thin lamina of monocrystalline silicon from a low cost substrate for the production of photovoltaic cells. Specific embodiments of the invention that may be used in this manner can be described with reference again to FIG. 2. FIG. 2 shows target chamber 205 containing target material structure 106. In specific embodiments of the invention, target material structure 106 can be a monocrystalline silicon wafer configured to receive the hydrogen ions from accelerator tube 103. In specific embodiments of the invention, accelerator tube 103 is configured to accelerate the hydrogen ions to energy levels in excess of 300 keV. In specific embodiments of the invention, the hydrogen ions are implanted into the monocrystalline silicon wafer between 0.5 and 50 µm beneath the surface of the monocrystalline silicon wafer to define a cleave plane. The silicon material above this cleave plane can then be cleaved from the wafer to form a thin lamina suitable for use in a photovoltaic cell.

A specific implementation of the present invention has been used to accelerate hydrogen ions without generating harmful neutron radiation. In this specific implementation, an H2PEM-100 hydrogen generator from Parker Hannfin Corporation is used to generate the feed gas for an ion implanter using 99.99995% (H) deuterium depleted water obtained from Campro Scientific. This specific implementation has been applied to a hydrogen implanter that uses 5 ppm deuterium depleted water for generation of the necessary hydrogen source-gas. This gas is directed into a suitable ion-source where it is converted into proton ion beams having an energy level of 420 keV and having beam currents between 30 milliamperes (mA) and 50 mA. The measured neutron radiation is less than 2.5 microsieverts (µSv) of dose equivalent radiation per hour. Therefore, the invention is capable of operating within OSHA safety standards for radiation exposure.

Implementing the invention as described in the previous paragraph provides unexpectedly beneficial performance. As mentioned previously, it is extremely important to minimize maintenance costs for ion implanters used to produce low variable cost products. Since deuterium is not accelerated within the system, the dump plates do not need to be replaced to avoid deuterium-deuterium collisions. Also, hydrogen generators are extremely efficient and can produce a long lasting stream of hydrogen gas without needing to be refilled. As a specific example, a particular implementation of the invention produced a continuous 15 sccm flow of hydrogen gas while consuming deuterium depleted water at a rate of one liter every 14,000 hours. This level of performance indicates that the potential maintenance-based variable cost of a production line utilizing an embodiment of the invention could be significantly minimized.

Figure 3:
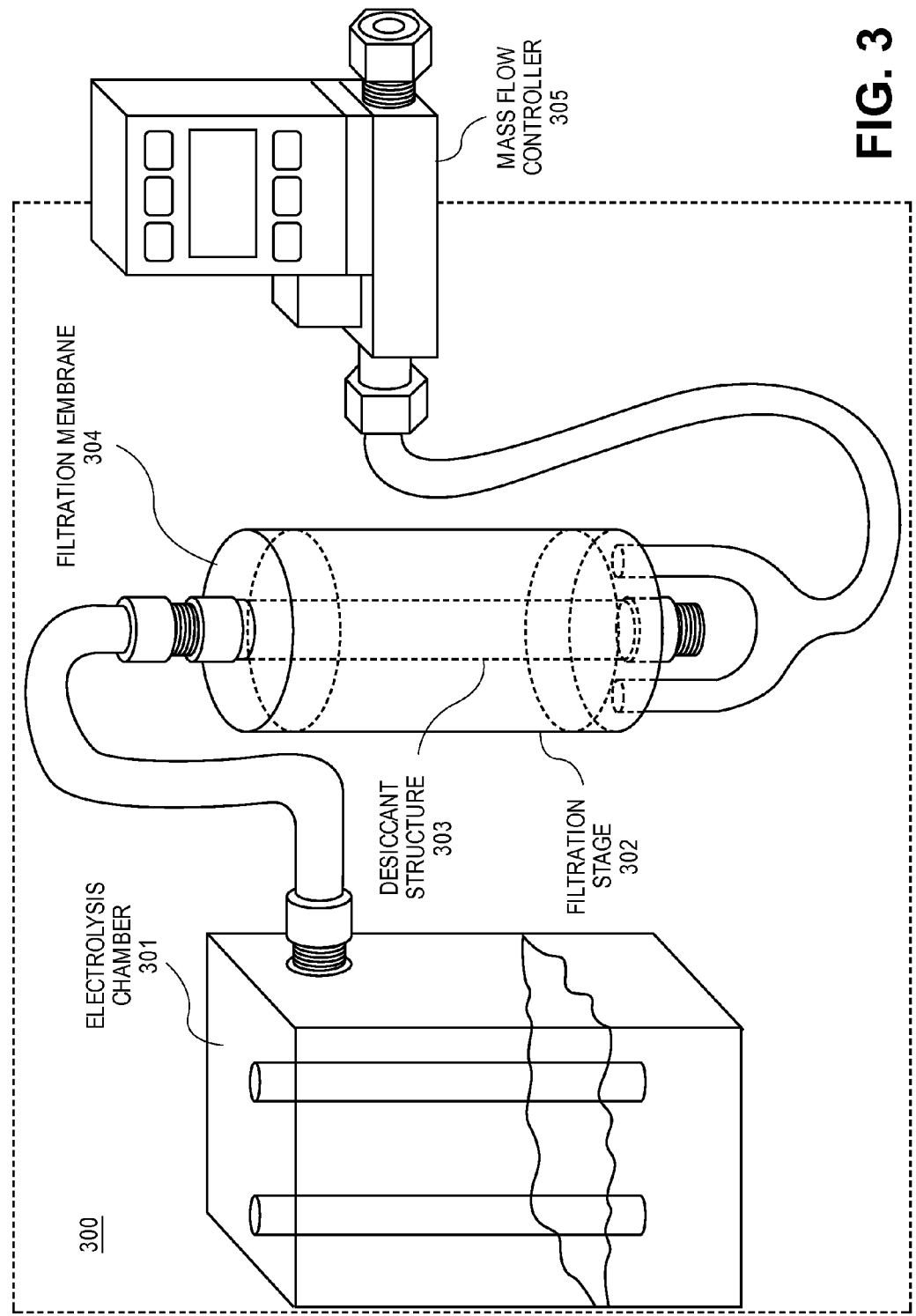
FIG. 3 illustrates a block diagram of a hydrogen generator and auxiliary circuitry that are in accordance with the present invention.

A specific embodiment of the invention can be described with reference to FIG. 3. FIG. 3 illustrates hydrogen generator 300 comprising electrolysis chamber 301 configured to produce a flow of hydrogen gas and filtration stage 302 connected to electrolysis chamber 301. Filtration stage 302 comprises a desiccant structure 303 and a filtration membrane 304 and is configured to reduce a moisture and impurity content of the flow of hydrogen gas. In specific embodiments of the invention, the hydrogen gas produced by the hydrogen generator flows to a mass flow controller such as mass flow controller 305. The mass flow controller can be a mass flow controller from MKS Instruments capable of limiting the flow of hydrogen gas to no more than 20 standard cubic centimeters per minute. As used in this description, a standard cubic centimeter is a unit of mass for gases equal to the mass of 1 cubic centimeter of the gas at a pressure of one atmosphere and at 0 degrees Celsius. Specific embodiments of the invention that utilize a mass flow controller such as mass flow controller 305 enhance the benefits that flow from not having to replace the hydrogen source because they can be used to accurately ration the hydrogen gas produced by the generator.

Aside from benefits associated with the reduction of maintenance costs, the use of a hydrogen generator rather than a hydrogen bottle results in an improved safety situation which can relax the overall cost of a safety compliant ion accelerator. High pressure hydrogen bottles have related safety concerns that make their use in industrial processes difficult to implement. In specific embodiments of the invention, the mass selection magnet and accelerator tube of the ion implanter are held at a much higher voltage than the target chamber. This high voltage creates the possibility for sparks that can ignite hydrogen gas that has leaked from the system into the surrounding area. Work place safety standards require that fail safe systems need to be in place capable of handling a total failure of the hydrogen bottle. In other words, a designer must contend with a hypothetical situation where all of the gas in the bottle is instantaneously leaked into the surrounding area. Therefore, the bottle needs to be held in a gas cabinet and the hydrogen gas may also have to be diluted. This will increase the costs associated with replacing the hydrogen tank as more gas will be required to supply the same level of hydrogen ions to the implanter. The use of a hydrogen generator obviates all of these safety concerns and the related problematic solutions. Since the generator only produces as much hydrogen gas as is needed by the system, there is no dangerous hydrogen gas to store and the water that is used to supply the generator does not have any associated safety restrictions.

The benefits of reducing the production of neutron radiation during high energy ion implantation can be realized by any system for accelerating hydrogen ions comprising a hydrogen gas source providing a flow of hydrogen gas that has an isotopic ratio of deuterium that is less than 100 ppm. This hydrogen gas source could be a hydrogen generator holding a supply of deuterium depleted water or it could be a high pressure bottle holding a supply of deuterium depleted gas. However, deuterium depleted gas is not readily commercially available. The reason a source for deuterium depleted gas is absent from the market is most likely because prior to the development of specific embodiments of the present invention there was no need for such gas to be produced. However, the gas could be produced through the electrolysis of deuterium depleted water followed by the capture and storage of the resulting hydrogen gas. Therefore, in specific embodiments of the present invention the hydrogen gas source is a high pressure bottle producing a flow of hydrogen gas having an isotopic ratio of deuterium that is less than 100 ppm.

Figure 4:
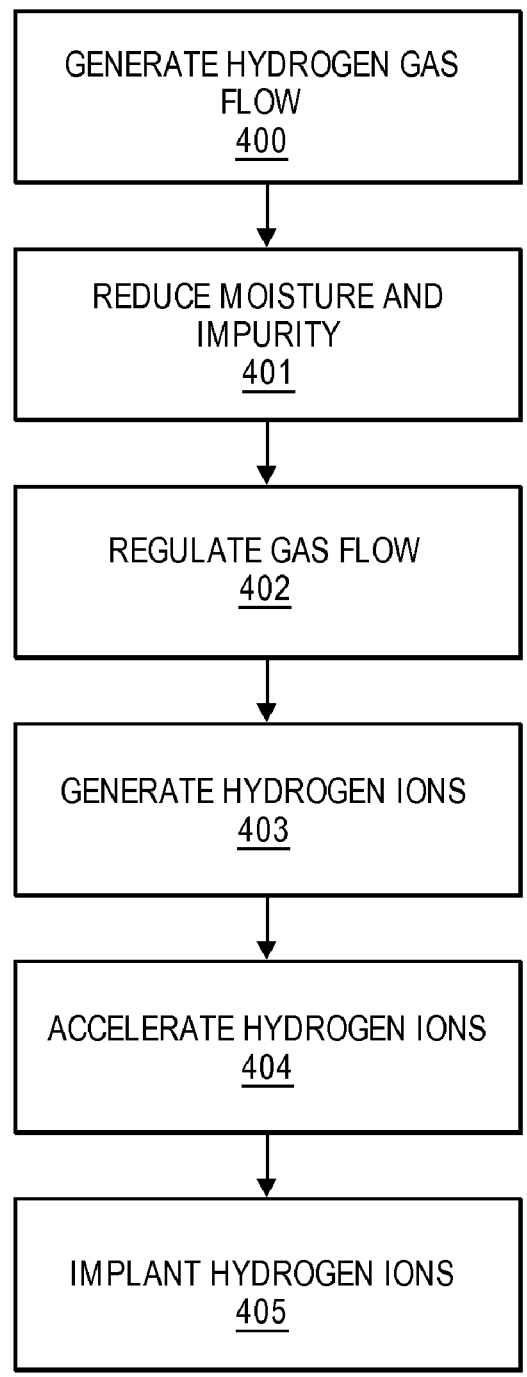
FIG. 4 illustrates a process flow chart of a method for accelerating ions that is in accordance with the present invention.

A method that is in accordance with specific embodiments of the present invention can be described with reference to FIG. 4. In step 400 a flow of hydrogen gas having an isotopic ratio of deuterium that is less than 100 ppm is generated using a hydrogen gas source. In specific embodiments of the invention, the hydrogen gas source will be a high pressure bottle. In specific embodiments of the invention, step 400 comprises the electrolysis of the water in an electrolysis chamber. In specific embodiments of the invention, the hydrogen gas source will be a hydrogen generator holding a supply of water having an isotopic ratio of deuterium that is smaller than the isotopic ratio of deuterium in VSMOW. In specific embodiments of the invention, the hydrogen gas source will be a hydrogen generator holding a supply of water having an isotopic ratio of deuterium that is smaller than 100 ppm.

Step 400 can be followed by several optional steps that process the generated hydrogen gas. In specific embodiments of the invention, step 400 is followed by optional step 401 in which the moisture and impurity content of said flow of hydrogen gas is reduced using a filtration stage connected to the electrolysis chamber. In specific embodiments of the invention, the filtration stage will comprise a desiccant structure and a filtration membrane. In specific embodiments of the invention, step 400 is followed by optional step 402 in which the generated flow of hydrogen gas is regulated to no more than 20 sccm. In specific embodiments of the invention, this step can be conducted using a mass flow controller.

The method in accordance with specific embodiments of the present invention can continue with steps 403, 404, and 405. In step 403 a plurality of hydrogen ions are produced from said flow of hydrogen gas using an ion source structure. In step 404, the plurality of hydrogen ions is accelerated using an accelerator tube. In specific embodiments of the invention, the hydrogen ions are accelerated to energies in excess of 300 keV in step 404. In specific embodiments of the invention, the method can continue with step 405 wherein at least a portion of the hydrogen ions are implanted into a monocrystalline silicon wafer held in a target chamber. The implanted ions are implanted between 0.5 and 50 μm beneath the surface of the monocrystalline silicon wafer to define a cleave plane. The lamina produced in step 405 can be used for the production of a photovoltaic cell, for example as described by Liang et al., U.S. patent application Ser. No. 12/894,254, "Semiconductor Assembly with a Metal Oxide Layer Having Intermediate Refractive Index," filed Sep. 30, 2010, owned by the assignee of the present application and hereby incorporated by reference.

Although embodiments of the invention have been discussed primarily with respect to specific embodiments thereof, other variations are possible. Various configurations of the described system may be used in place of, or in addition to, the configurations presented herein. Those skilled in the art will appreciate that the foregoing description is by way of example only, and is not intended to limit the invention. For example, although the feed gas was generally referred to as if it was pure hydrogen, embodiments of the present invention would work with feed gas consisting of a mix of hydrogen and helium or hydrogen mixed with any number of other gases. As used herein, the term "flow of hydrogen gas" does not preclude the presence of other chemicals besides hydrogen being mixed with the hydrogen. As used herein, the term "isotopic ratio" refers to the ratio of a specific isotope to the most common isotope of a given element. Also, the specific application of photovoltaic cell production was noted but the invention would function with any system utilizing accelerated hydrogen ions. Furthermore, nothing in the disclosure should indicate that the invention is limited to systems that involve implanting ions. In general, any diagrams presented are only intended to indicate one possible configuration, and many variations are possible. Those skilled in the art will also appreciate that methods and systems consistent with the present invention are suitable for use in a wide range of applications encompassing any related to accelerated particles.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A system for accelerating hydrogen ions comprising:
   a hydrogen generator holding a supply of water and configured to generate a flow of hydrogen gas from said supply of water;
   an ion source structure configured to generate a plurality of hydrogen ions from said flow of hydrogen gas; and
   an accelerator tube configured to accelerate said plurality of hydrogen ions;
   wherein said supply of water has an isotopic ratio of deuterium that is smaller than the isotopic ratio of deuterium in Vienna Standard Mean Ocean Water.

2. The system from claim 1, wherein said isotopic ratio of deuterium is less than 100 parts per million.

3. The system from claim 1, wherein said system produces less than 2.5 microsieverts of dose equivalent radiation per hour when said plurality of hydrogen ions has a flow rate in excess of 30 milliamperes and energies in excess of 420 kilo-electron volts.

4. The system from claim 1, wherein said hydrogen generator is configured to generate said flow of hydrogen gas through the electrolysis of said supply of water.

5. The system from claim 4, said hydrogen generator comprising:
   an electrolysis chamber configured to produce said flow of hydrogen gas; and
   a filtration stage connected to said electrolysis chamber, said filtration stage having a desiccant structure and a filtration membrane, wherein said filtration stage is configured to reduce a moisture and impurity content of said flow of hydrogen gas.

6. The system from claim 1, further comprising a mass flow controller connecting said hydrogen generator to said ion source structure, and configured to regulate said flow of hydrogen gas.

7. The system from claim 6, wherein said mass flow controller limits said flow of hydrogen gas during operation to no more than 20 standard cubic centimeters per minute.

8. The system from claim 1, said system further comprising:
a target chamber containing a monocrystalline silicon wafer and configured to receive said plurality of hydrogen ions from said accelerator tube, wherein said plurality of hydrogen ions are implanted into said monocrystalline silicon wafer between 0.5 and 50 micrometers beneath a surface of the monocrystalline silicon wafer to define a cleave plane.

9. The system from claim 8, wherein said accelerator tube is configured to accelerate said plurality of hydrogen ions to an energy level in excess of 300 kilo-electron volts.

10. The system from claim 8, wherein a layer of said monocrystalline silicon wafer located above said cleave plane is used in a photovoltaic cell.

11. A system for accelerating hydrogen ions comprising:
a hydrogen gas source providing a flow of hydrogen gas;
an ion source structure configured to receive said flow of hydrogen gas and generate a plurality of hydrogen ions; and
an accelerator tube configured to receive and accelerate said plurality of hydrogen ions, wherein an isotopic ratio of deuterium in said flow of hydrogen gas is less than 100 parts per million.

12. The system from claim 11, wherein said hydrogen gas source is in a pressurized bottle.

13. The system from claim 11, wherein said hydrogen gas source is a hydrogen generator holding a supply of water.

14. The system from claim 11, said system further comprising:
a target chamber containing a monocrystalline silicon wafer and configured to receive said plurality of hydrogen ions from said accelerator tube, wherein said plurality of hydrogen ions are implanted into said monocrystalline silicon wafer between 0.5 and 50 micrometers beneath a surface of the monocrystalline silicon wafer to define a cleave plane; and wherein a layer of said monocrystalline silicon wafer located above said cleave plane is used in a photovoltaic cell.

15. A method comprising the steps of:
generating a flow of hydrogen gas using a hydrogen gas source;
generating a plurality of hydrogen ions from said flow of hydrogen gas using an ion source structure; and
accelerating said plurality of hydrogen ions using an accelerator tube, wherein an isotopic ratio of deuterium in said flow of hydrogen gas is less than 100 parts per million.

16. The method of claim 15, wherein said hydrogen gas source is in a bottle.

17. The method of claim 15, wherein:
said hydrogen gas source is a hydrogen generator holding a supply of water, and said supply of water has an isotopic ratio of deuterium that is smaller than 100 parts per million.

18. The method of claim 17, wherein the step of generating a flow of hydrogen gas comprises the electrolysis of said supply of water in an electrolysis chamber.

19. The method of claim 18, further comprising the step of:
reducing a moisture and impurity content of said flow of hydrogen gas using a filtration stage connected to said electrolysis chamber, wherein said filtration stage comprises a desiccant structure and a filtration membrane.

20. The method of claim 15, further comprising the step of:
implanting at least a portion of said plurality of hydrogen ions in a monocrystalline silicon wafer, said monocrystalline silicon wafer being held in a target chamber,
wherein said implanting step implants said portion of said plurality of hydrogen ions between 0.5 and 50 micrometers beneath a surface of said monocrystalline silicon wafer to define a cleave plane, and
wherein said accelerating step accelerates said portion of said plurality of hydrogen ions to energies in excess of 300 kilo-electron volts.

21. The method of claim 20, wherein a layer of said monocrystalline silicon wafer located above said cleave plane is used in a photovoltaic cell.

22. The method of claim 20, wherein said hydrogen gas source is a hydrogen generator holding a supply of water, and wherein said step of generating a flow of hydrogen gas is conducted through the electrolysis of said supply of water in an electrolysis chamber, and said supply of water has an isotopic ratio of deuterium that is smaller than the isotopic ratio of deuterium in Vienna Standard Mean Ocean Water.

23. The method of claim 22, further comprising the step of regulating said flow of hydrogen gas to no more than 20 standard cubic centimeters per minute.

\* \* \* \* \*